(12) United States Patent
Tomita (10) Patent No.: US 10,943,660 B2
(45) Date of Patent: Mar. 9, 2021

(54) RESISTIVE MEMORY

(71) Applicant: Winbond Electronics Corp., Taichung (TW)

(72) Inventor: Yasuhiro Tomita, Taichung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 16/801,878

(22) Filed: Feb. 26, 2020

(65) Prior Publication Data

US 2020/0279606 A1 Sep. 3, 2020

(30) Foreign Application Priority Data

Feb. 28, 2019 (JP) .............................. JP2019-036575

(51) Int. Cl.
*G11C 13/00* (2006.01)

(52) U.S. Cl.
CPC ...... *G11C 13/0069* (2013.01); *G11C 13/0026* (2013.01); *G11C 13/0028* (2013.01); *G11C 2013/0078* (2013.01)

(58) Field of Classification Search
None
See application file for complete search history.

(56) References Cited

U.S. PATENT DOCUMENTS

| 5,555,212 A | 9/1996 | Toshiaki et al. |
| 8,654,559 B2 | 2/2014 | Nakano et al. |
| 2008/0007993 A1 | 1/2008 | Saitoh et al. |
| 2010/0265757 A1* | 10/2010 | Otsuka ................ H01L 45/1266 365/148 |
| 2012/0044770 A1 | 2/2012 | Lee et al. |

FOREIGN PATENT DOCUMENTS

| JP | 5748877 B1 | 7/2015 |
| KR | 20130091551 A | 8/2013 |
| KR | 20150028726 A | 3/2015 |
| TW | 536705 B | 6/2003 |
| TW | I258144 B | 7/2006 |
| TW | 201214434 A | 4/2012 |
| TW | 201535365 A | 9/2015 |

OTHER PUBLICATIONS

Korean Office Action in application No. 10-2020-0019297 dated Nov. 25, 2020 and its English translation; pp. 1-8.

* cited by examiner

*Primary Examiner* — James G Norman
(74) *Attorney, Agent, or Firm* — Muncy, Geissler, Olds & Lowe, PC (57) ABSTRACT

A resistive memory includes an array area where memory cells are arranged in rows and columns, word lines connected to the memory cells in a row direction, a local bit line extending in a column direction, local source lines, a shared bit line, and a writing device. Each memory cell includes a variable resistance element and an accessing transistor. The local source lines extend in the column direction and are connected to first electrodes of the memory cells in the column direction. The shared bit line is connected to the local bit line and second electrodes of the memory cells in the row direction. The writing device pre-charges the bit line and the source lines to a first voltage and applies a write pulse to the selected memory cell by discharging the corresponding selected source line after applying a write voltage to the selected word line, the writing device.

10 Claims, 8 Drawing Sheets

RESISTIVE MEMORY

CROSS REFERENCE TO RELATED APPLICATIONS

This application claims priority of Japanese Patent Application No. 2019-036575, filed on Feb. 28, 2019, the entirety of which is incorporated by reference herein.

BACKGROUND OF THE INVENTION

Field of the Invention

The invention relates to a resistive memory using resistive elements, and more particularly to a write operation for memory cells.

Description of the Related Art

In resistive access memories using variable resistance elements, writing a low-resistance state to a variable resistance element is generally referred to as SET, and writing a high resistance state to a variable-resistance element is generally referred to as RESET. There are a unipolar type and a bipolar type for variable-resistance memories. In the unipolar type, the polarity of the write voltage applied to a variable resistance element during the setting is the same as that during the resetting and the setting or resetting is performed by changing the write voltage. On the other hand, in the bipolar type, the polarity of the write voltage applied to the variable resistance element during the setting is reverse to that during the resetting (Patent Document 1).

Figure 1A:
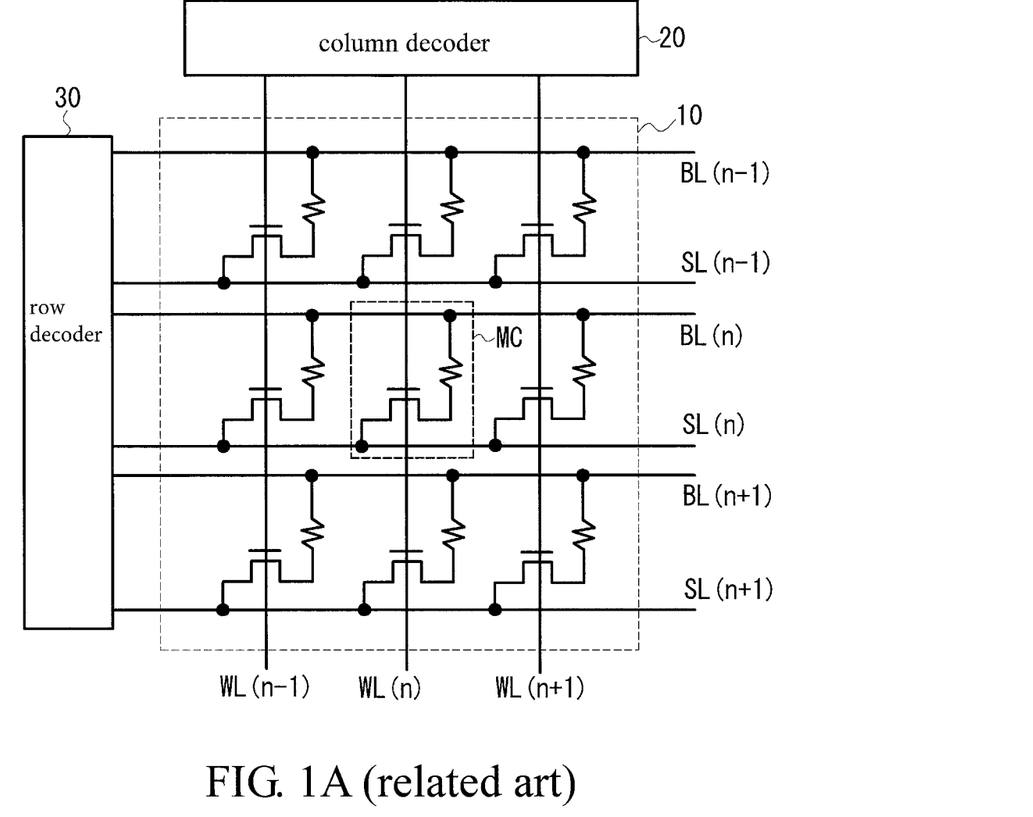
FIG. 1A shows an array configuration of a conventional resistive random access memory.

FIG. 1A shows a circuit diagram of a memory array 10 of a bipolar-type resistive memory, wherein part of memory cells (the memory cells arranged in 3 rows×3 columns) are illustrated. Each memory cell MC is composed of a variable resistance element and an accessing transistor connected in series with the variable resistance element, which is referred to as a configuration of 1T×1R. The gates of the plurality of accessing transistors are respectively connected to the word lines WL(n−1), WL(n), and WL(n+1), the drain regions thereof are respectively connected to the first electrodes of the variable resistance elements, and the source regions thereof are respectively connected to the source lines SL(n−1), SL(n), and SL(n+1). The second electrodes (the other electrodes) of the variable resistance elements are respectively connected to the bit lines BL(n−1), BL(n), and BL(n+1).

One variable resistance element is made of a thin film oxide of a transition metal such as a hafnium oxide (HfOx), and is set or reset according to the polarity and magnitude of the write pulse voltage. The memory cells can be randomly accessed by taking one bit as the unit. For example, when a memory cell MC is accessed, the word line WL(n) is selected by the column decoder 20 to turn on the accessing transistor of the memory cell MC, and the bit line BL(n) and the source line SL(n) are selected by the row decoder 30. In the cases of the write operation, the write voltage corresponding to the setting or resetting is applied to the selected bit line BL(n) and the selected source line SL(n). In the cases of the read operation, the voltage or current corresponding to the setting or resetting of the variable resistance element appears on the selected bit line BL(n) and the selected source line SL(n), which are detected by the detection circuit.

Figure 1B:
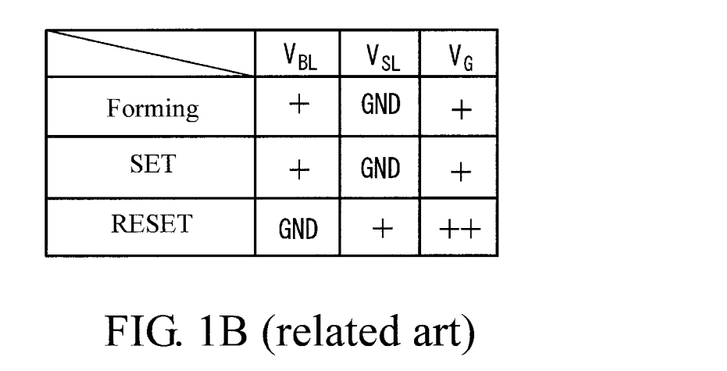
FIG. 1B is a table showing bias conditions during operations.

Further, in the cases where a thin film of a metal oxide, such as a hafnium oxide (HfOx), is used as the material of the variable resistive elements, it is necessary to perform a forming process on the metal oxide for a starting setting. Usually, the forming process is performed, such that a variable resistance element is close to, for example, a low resistance state (that is a setting state), by applying a voltage Vf, which is larger than the applied voltage during the write operation of the variable resistance element. FIG. 1B shows an example of the bias voltages during the forming, setting, and resetting. "+" indicates a positive voltage.

PRIOR TECHNICAL DOCUMENTS

Patent Documents

[Patent Document 1] Japan Patent No. 5748877

BRIEF SUMMARY OF THE INVENTION

Problems to be Solved by the Invention

A bipolar-type resistive memory requires a bidirectional write voltage to be applied between a bit line and a source line, thereby injecting a cell current. It is important for a memory with high reliability to make the write voltages written to all the memory cells uniform. Therefore, in the bipolar type, a dedicated source line extending in the same direction as the bit line is configured in a one-to-one relationship with respect to the bit line, so that symmetry in which the bit line and the source line can be replaced with each other is achieved.

However, in such a memory array structure, for example, a dedicated source line is arranged for a bit line, so that when a highly integrated memory is formed, the source line becomes an obstacle to reducing of the width of the memory array in the column direction. In addition, when the bit lines and the source lines are formed in parallel in the same direction and with the same metal layer, the line width of the bit lines/source lines is reduced with miniaturization, and it becomes difficult to achieve the low resistance of the source lines. The resistance of the source lines is an important factor for a reliable write operation, that is, currents flow through the source lines during the write operation, and once the resistance of the source lines becomes larger, the voltage drop also becomes larger and cannot be ignored. In order to obtain high reliability, it is desirable that a constant read voltage/write voltage is applied to each variable resistance element of the memory array. However, if the voltage drop induced by the source lines becomes large, the degree of the variation in the voltage applied to each variable resistance element becomes large. Therefore, it is preferable to form a source line having a sufficient line width, and, however, the area of the memory array increases (this condition is also occurred even if the bit lines are replaced with the source lines). In order to reduce the area of the memory array, sharing a bit line (or source line) that is sufficiently thick can be considered. In addition, when the writing is performed from the bit-line side, if the load capacitance on the bit-line side is too large, a large drive current is required when a write pulse is applied, so it is also preferable to suppress the peak value of the power consumption.

An object of the present invention is to provide a resistive random access memory with excellent area efficiency without reducing reliability. It is another object of the present invention to provide a resistive random access memory having improved power efficiency during a write operation.

Means to Solve the Problems

An exemplary embodiment of a resistive memory is provided. The resistive memory memorizes data using reversible and non-volatile variable resistance elements and comprises an array area, a plurality of word lines, at least one bit line, a plurality of source lines, a shared bit line, and a writing device. In the array area, a plurality of memory cells are arranged in a plurality of rows and a plurality of columns. Each of the plurality of memory cells comprises one of the plurality of variable resistance elements and an accessing transistor connected to the variable resistance element. The plurality of word lines are connected to the memory cells in a row direction. The least one bit line extends in a column direction. The plurality of source lines extend in the column direction and are connected to first electrodes of the memory cells in the column direction. The shared bit line is connected to the at least one bit line. The shared bit line extends in the row direction and is connected to second electrodes of the memory cells in the row direction. The writing device performs a write operation on the selected memory cells. The writing device pre-charges the selected bit line and the selected source lines to a first voltage, and after applying a write voltage to the selected word line, the writing device applies a write pulse to the selected memory cell by discharging the corresponding selected source line.

Efficacy of the Inventive

According to the present invention, since the array area is composed of shared bit lines, the number of bit lines or source lines extending in the column direction in the array area is reduced, such that, the area of the array area can be reduced while the line width of the bit lines or source lines is increased. Thus, the resistance of the bit lines or the source lines can be reduced, and the voltages applied to the memory cells in the array area can be kept uniform for performing high-reliability read and write operations.

In addition, according to the present invention, since the selected bit line and the plurality of source lines are pre-charged, a write pulse is applied to the selected cell by discharging the selected source line, which can suppress the peak value of the power consumption. In addition, when a write operation is performed on a plurality of memory cells continuously, the source lines connected to the unselected memory cells is being pre-charged. Thus, when the memory cells are written, it is unnecessary to apply a voltage to the source line, which can be suppress the overall power consumption. Moreover, by keeping the pre-charge voltage constant, it is possible to easily control the write interference accompanied by the pre-charging by controlling the write intensity using the discharge current of the source lines, thereby achieving a highly reliable write manner.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Next, embodiments of the present invention will be described in detail with reference to the drawings. In an embodiment of the present invention, a resistive memory comprises an array configuration of shared bit lines in which bit lines are shared by a plurality of memory cells.

Embodiments

Figure 2:
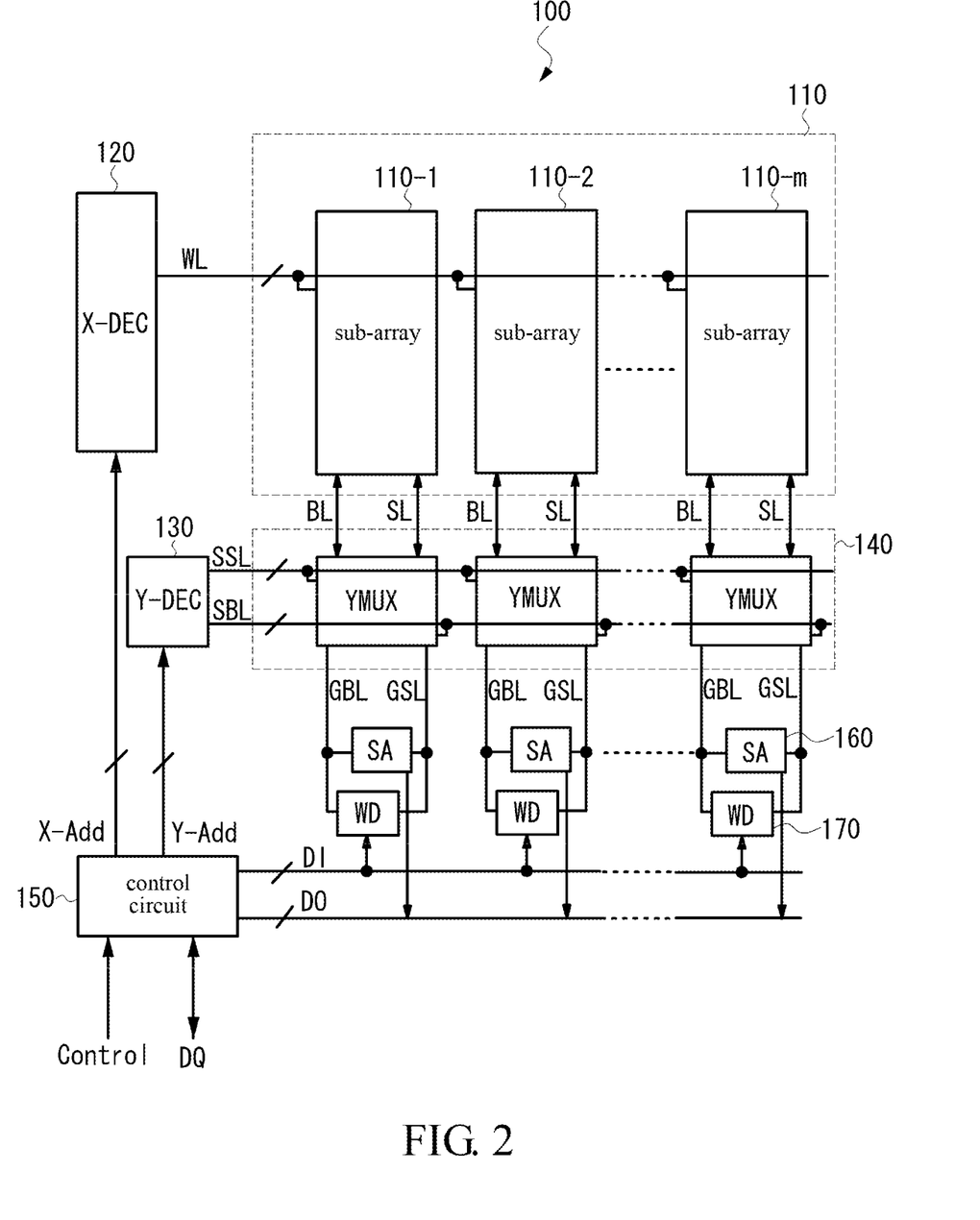
FIG. 2 is a block diagram showing a schematic configuration of a resistive random access memory according to an exemplary embodiment of the present invention.

FIG. 2 is a block diagram showing a schematic configuration of a resistive random access memory according to an exemplary embodiment of the present invention. A resistive memory 100 of the present embodiment comprises a memory array 110, a row decoder and driver circuit (X-DEC) 120, a column decoder and driver circuit (Y-DEC) 130, column selection circuits (YMUX) 140, a control circuit 150, sense amplifiers (SA) 160, and write driver and read bias circuits (WD) 170. The memory array 110 is composed of memory cells arranged in a matrix having rows and columns. Each of the memory cells comprises a variable resistance element and an accessing transistor. The row decoder and driver circuit (X-DEC) 120 selects and drives the word line(s) WL based on a row address X-Add. The column decoder and driver circuit (Y-DEC) 130 generates selection signals SSL and SBL based on a column address Y-add for selecting global bit lines GBL and global source lines GSL. One column selection circuit (YMUX) 140 selects the connection between one global bit line GBL and a corresponding bit line BL and the connection between one global source line GSL and a corresponding source line SL based on the selection signals SSL and SBL. The control circuit 150 controls each component or portion based on instructions, addresses, data, etc. received from the outside. Each sense amplifier 160 senses the read data of a corresponding memory cell via the corresponding bit lines GBL/BL. Each write driver and the read bias circuit 170 applies a bias voltage for a read operation via the bit lines GBL/BL and applies a voltage according to the setting and resetting performed during a write operation.

The memory array 110 comprises m sub-arrays 110-1, 110-2, ..., 110-m. m column selection circuits (YMUX) 140 correspond to the m sub-arrays 110-1, 110-2, ..., 110-m and are connected to them, respectively. The m column selection circuits (YMUX) 140 are connected to the sense amplifiers 160 and the write driver and read bias circuits 170, respectively. Each sense amplifier 160 is connected to the control circuit 150 via an internal data bus DO, and the result sensed by the sense amplifier 160 is output to the control circuit 150 via the internal data bus Do. In addition, each write driver and read bias circuit 170 is connected to the control circuit 150 via an internal data bus DI, and each write driver and read bias circuit 170 is controlled by a control signal Control to receive write data via the internal data bus DI.

In the first embodiment of the present invention, the memory array 110 has a configuration in which shared bit lines are disposed. In the following description, the bit lines and the source lines which extend from the column selection circuits 140 to the memory array 110 and are orthogonal to the word lines WL are referred to as the local bit lines BL and the local source lines SL, respectively. A bit line which extends from the local bit line BL and is in parallel with the word lines WL is referred to as a shared bit line S_BL.

Figure 3:
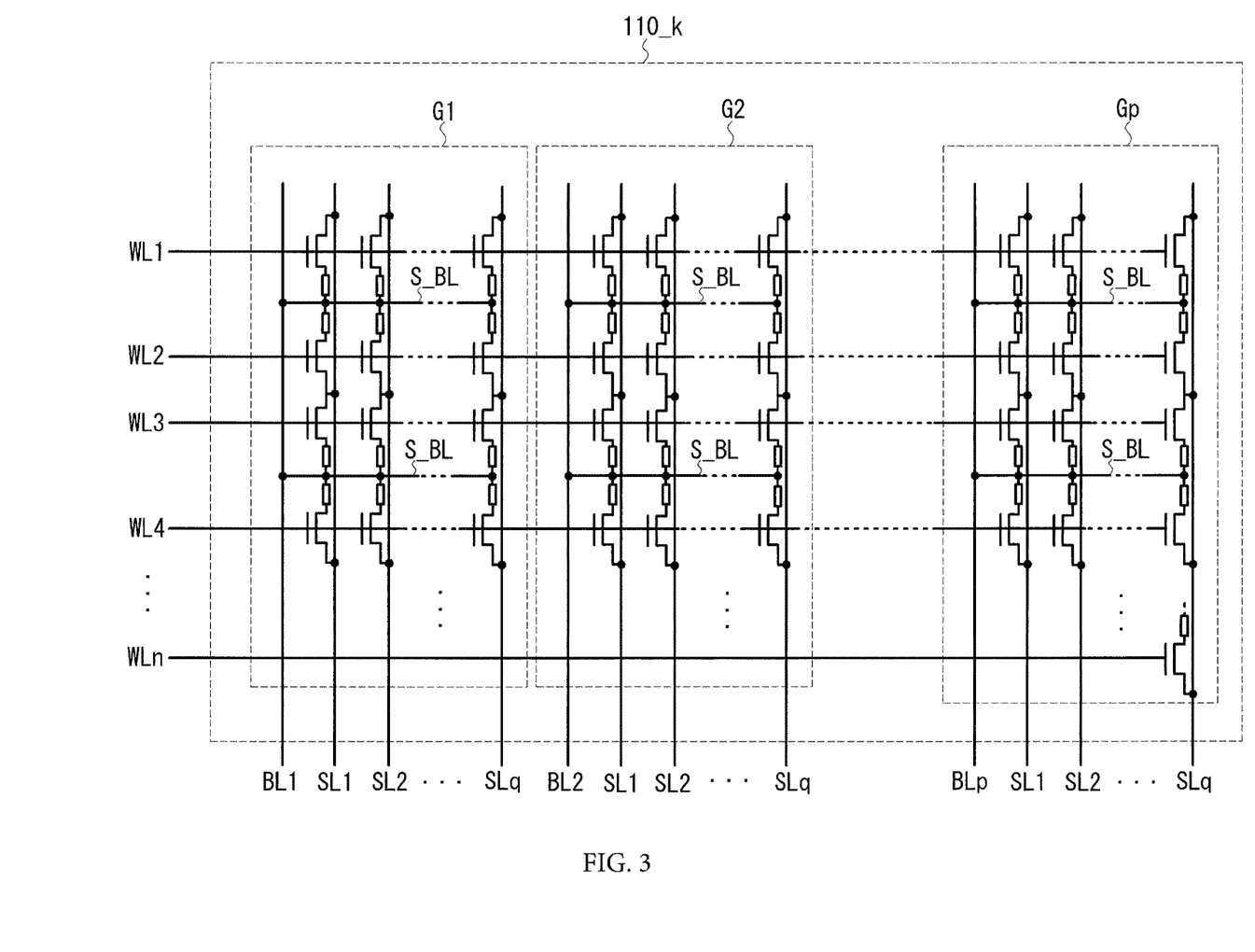
FIG. 3 is a circuit diagram of a portion of a memory array composed of shared bit lines according to an embodiment of the present invention.

FIG. 3 is a circuit diagram of a portion of a memory array composed of shared bit lines according to an embodiment of the present invention. In this figure, only the k-th sub-array 110-k of the memory array 110 is shown for example. It should be noted that the other sub-arrays have the same configuration.

The sub-array 110-k is divided into p groups G1, G2, ..., Gp in the row direction, and one group comprises memory cells arranged on n rows and q columns. A memory cell comprises an accessing transistor and a variable resistance element coupled to the accessing transistor in series. The variable resistance element is composed of, for example, a transition metal oxide (TMO). The connection of the memory cells in the column direction causes that the variable resistance elements of a pair of memory cells are connected in series. Each of the shared bit lines S_BL extends in the row direction, so that the nodes between the variable resistance elements of the pair of memory cells are shorted in the row direction.

Each of the word lines WL1~WLn extends in the row direction and is commonly connected to the gates of the accessing transistors of the memory cells, which are disposed in the row direction, in the groups G1~Gp. The local bit lines BL and the local source lines SL extend in the column direction, and one local bit line BL is allocated in one group. In other words, the local bit lines BL1, BL2, ..., BLp are allocated in the respective groups G1~Gp. Further, for one local bit line BL, a plurality of shared bit lines S_BL extending in parallel with the word lines are connected to the local bit line BL. As shown in FIG. 3, each shared bit line S_BL extends in the row direction and is commonly connected to the variable resistance elements of q pairs of memory cells in the row direction, so that a short circuit is made between the nodes between the variable resistance elements. At this time, if there are n word lines in one group, n/2 shared bit lines S_BL are formed in the same group. In FIG. 3, one shared bit line S_BL is connected to a pair of memory cells disposed in the column direction, however, without limitation. In another aspects, two shared bit lines S_BL are provided to a pair of memory cells disposed in the column direction. That is, one shared bit line SBL extending in the row direction as shown in FIG. 3 is replaced with two shared bit lines extending in the row direction. In this case, n shared bit lines SBL are formed in one group, and, compared with the embodiment where n/2 shared bit lines are formed in one group, the parasitic capacitance of the array can be reduced. One local source line SL is commonly connected to the accessing transistor of the memory cells in the column direction. Further, in the embodiment, one column line connected to the variable-resistance-element sides of the memory cells is used as the bit line, and one column lines connected to the accessing transistors on the opposite sides are used as the source line.

Figure 4A:
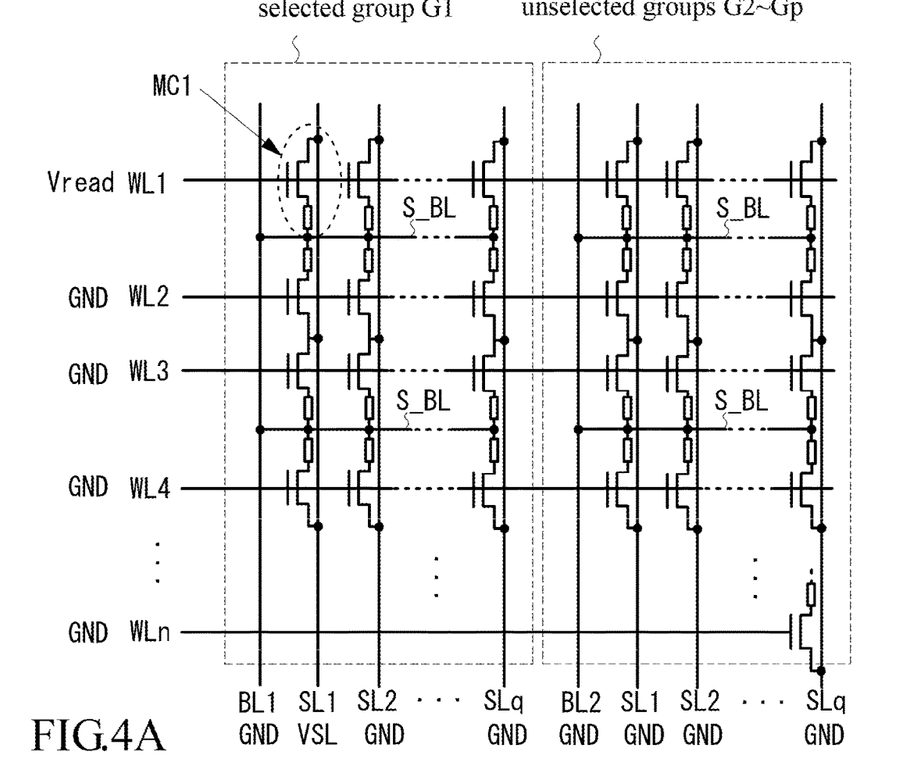
FIGS. 4A-4C are schematic diagrams showing a read operation of a resistive random access memory according to an embodiment of the present invention.
Figure 4B:
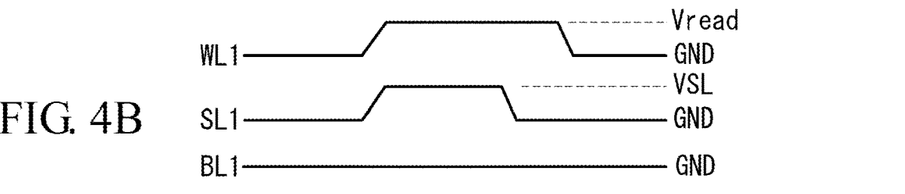
Figure 4C:
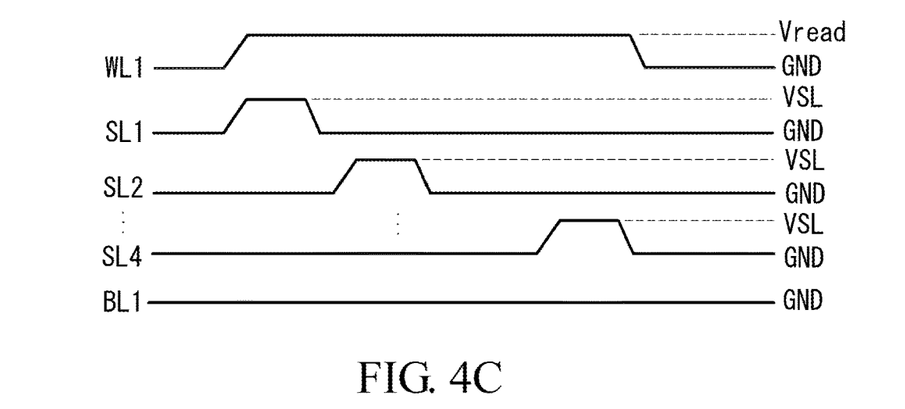

In the following, the operations of the resistive memory of the embodiment will be described. First, a read operation is explained. FIGS. 4A, 4B, and 4C show the bias conditions and timing charts of the waveforms of the applied voltages for the selected group and the unselected groups in the read mode. Here, it is assumed that the group G1 is selected, and the memory cell MC1 is selected by the word line WL1, the local bit line BL1, and the local source line SL1 of the group G1.

The column decoder and driver circuit 130 outputs the selection signals SBL/SLL, which are applied for selecting the global bit line GBL and the global source line GSL, to the column selection circuits 140 based on the column address Y-Add. One column selection circuit 140 is enabled in response to the selection signals SBL/SLL, and the remaining column selection circuits 140 are disabled. The enabled column selection circuit 140 selects one sub-array from the memory array 110, and further selects a connection between the global bit line GBL and the local bit line BL and a connection between the global source line GSL and the local source line SL in a group which is selected from the selected sub-array. In addition, the row decoder and driver circuit 120 selects the word line WL1 based on the row address X-Add.

As shown in FIG. 4A, in the selected group G1, the write driver and read bias circuit 170 applies the ground voltage GND (0V) to the local bit line BL1, applies a read voltage VSL to the local source line SL1, and applies the ground voltage GND to the source lines SL2 to SLq. The write driver and read bias circuit 170 applies the ground voltage GND to all of the bit lines BL2~BLp and the local source lines SL2~SLq of the unselected groups G2~Gp. Further, the row decoder and drive circuit 120 applies a read voltage Vread to the selected word line WL1 and applies the ground voltage GND to the unselected word lines.

As shown in FIG. 4B, the read voltage Vread is applied to the selected word line WL1, the read voltage VSL is applied to the selected local source line SL1, and the ground voltage GND is applied to the selected local bit line BL1. At this time, the shared bit lines S_BL connected to the selected local bit line BL1 are also at the level of the ground voltage GND. Accordingly, the accessing transistor of the selected memory cell MC1 is turned on. If the variable resistance element is in a low resistance state (SET), there is a larger current from the global source line GSL/local source line SL1 to the shared bit lines S_BL, the local bit BL1, and the global bit line GBL. On the other hand, if the variable resistance element is in a high resistance state (RESET), there is almost no current flowing in the global bit line GBL. The corresponding sense amplifier 160 senses the voltage or current of the global bit line GBL, and outputs the data "0" and "1", which is obtained based on the sensing result, by the output terminal DQ. In addition, the accessing transistors of the memory cells in the same row as the selected memory cell MC1 are turned on. However, since the voltages of the unselected local source lines SL2~SLq and the voltages of the shared bit lines S_BL are at the same level, there is no current flowing between the unselected local source lines and the selected local bit line. Further, in the cases where the data is read from a selected local source line, the parasitic capacitance of the selected local source line SL is substantially smaller than that of the corresponding local bit line BL connected to the shared bit lines S_BL. Thus, compared with the cases where the data is read from a local bit line BL, it can be implemented at high speed and low current consumption.

In addition, when a plurality of memory cells connected to the selected word line WL1 are continuously read, as shown in FIG. 4C, the read voltage VSL is sequentially applied to the local source lines SL1, SL2, . . . , SL4 for the state where the read voltage Vread is applied to the selected word line WL1.

Figure 5:
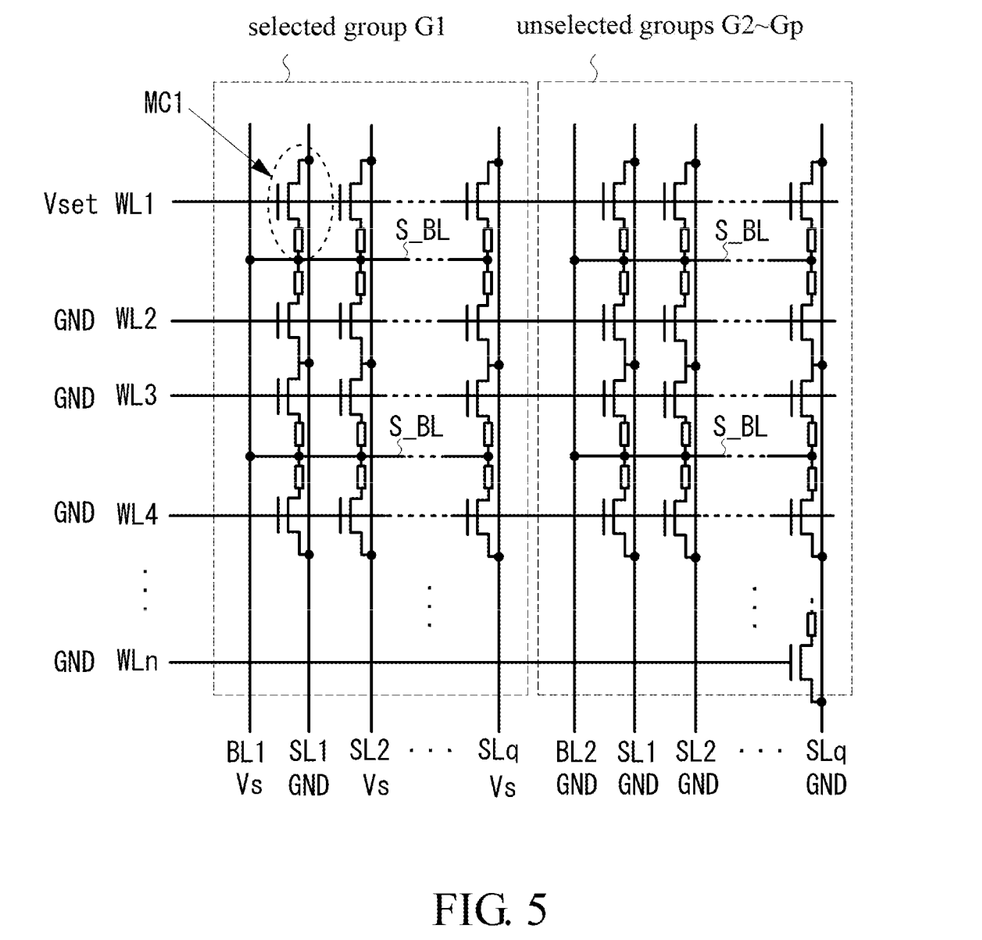
FIG. 5 is a schematic diagram showing a SET write operation of a resistive random access memory according to an embodiment of the present invention.

Next, the write operation will be described. "SET write" is an operation mode in which a variable resistance element is written to a low resistance state. As shown in FIG. 5, when a SET write operation is performed on the selected memory cell MC1, the write driver and read bias circuit 170 applies a write voltage Vs to the local bit line BL1 and the unselected local source lines SL2~SLq of the selected group G1 and further applies a write pulse having the amplitude of the ground voltage GND to the selected local source SL1. A write voltage Vset (Vset>Vs) is applied to the selected word line WL1, and the ground voltage GND is applied to the unselected word lines. In addition, all of the local bit lines and the local source lines of the unselected groups G2~Gp are at the level of the ground voltage GND or the same potential.

In addition, the write driver and read bias circuit 170 of the embodiment can control the write intensity by changing the write voltage Vset applied to the selected word line. The so-called write intensity refers to the resistance variation of each write pulse Vs. When the resistance value of the variable resistance element is set to a desired value, the number of write pulses and the current resistance value are read, and the read resistance value is compared with a reference resistance. This process is repeated for controlling the write intensity.

Accordingly, in the selected memory cell MC1, the bias voltage is applied from the local bit line BL1, and a current for the SET writing flows from the local bit line BL1 to the local source line SL1. At this time, in the memory cells connected to the selected word line WL1 in the row direction, the write voltage Vs is being applied via the shared bit line S_BL, and the write voltage Vs is also being applied to the region source lines SL2~SLq. However, since the bias voltage is not applied to the non-selected memory cells, the current for SET writing does not flow. In addition, since the selected word lines WL2~WLn is at the level of the ground voltage GND, the corresponding memory cells connected to the local source line SL1 and disposed in the column direction are not applied by the bias voltage.

Figure 6A:
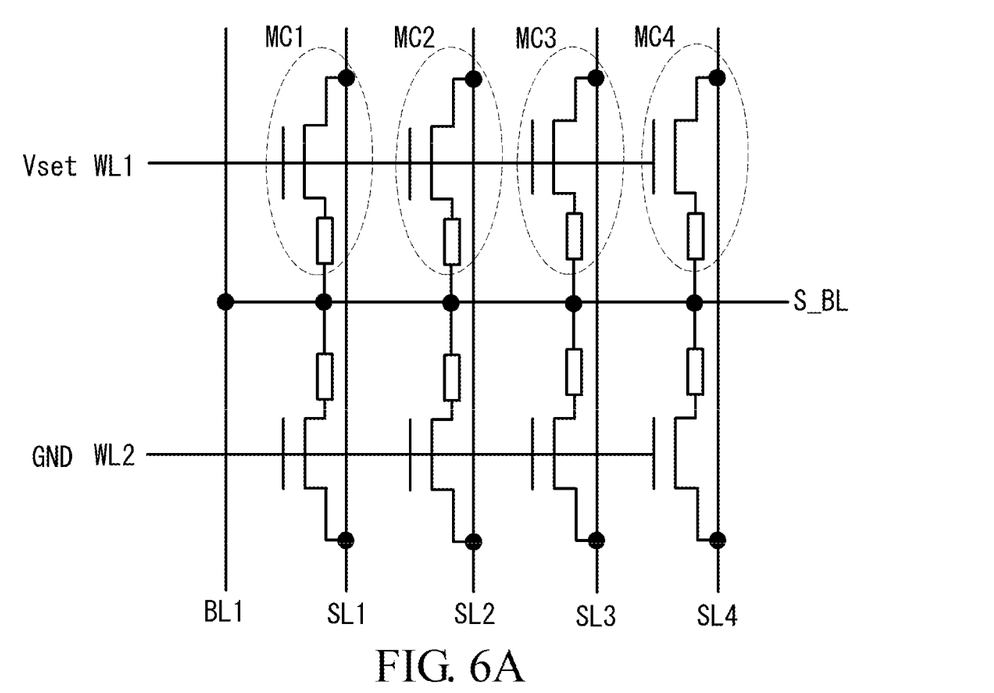
FIG. 6A is a circuit diagram of a portion of a selected group G1 in FIG. 5.
Figure 6B:
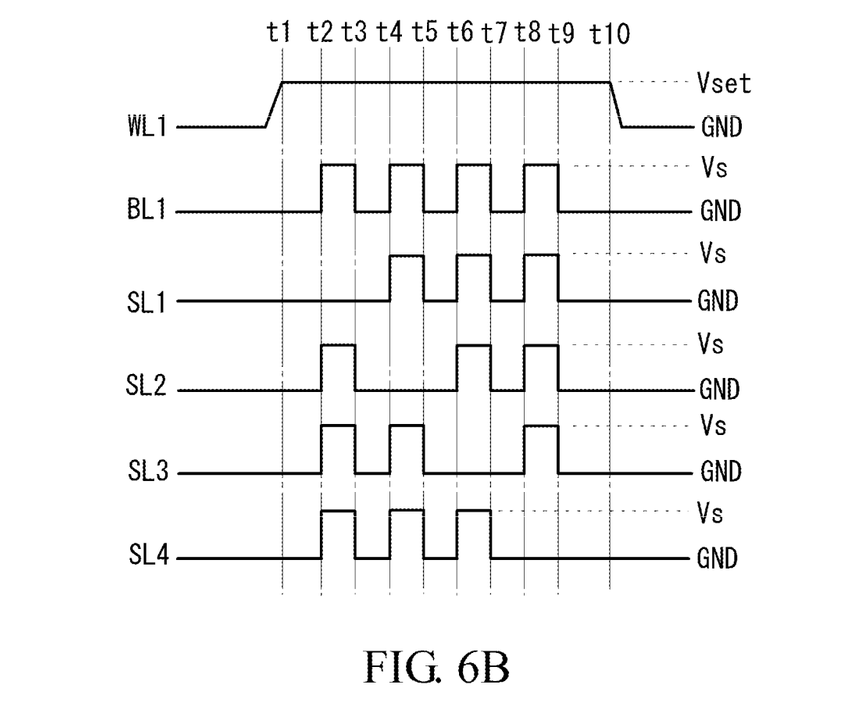
FIG. 6B is a timing chart when a SET write operation is performed on memory cells MC1, MC2, MC3, and MC4 continuously.

FIG. 6(A) shows a part of the selected group G1 in FIG. 5. It is assumed that the shared bit line S_BL is commonly connected to the four memory cells MC1, MC2, MC3, and MC4. In addition, FIG. 6B is a timing chart when a SET write operation is performed on memory cells MC1, MC2, MC3, and MC4 continuously.

During the period from the time point t1 to the time point t10, a write voltage Vset is applied to the selected word line WL1. During the period from the time point t2 to the time point t3, a write voltage Vs is applied to the local bit line BL1, a ground voltage GND is applied to the local source line SL1, and a voltage Vs which has the same level as the write voltage Vs is applied to the unselected local source lines SL2, SL3, and SL4, thereby performing a SET write operation is performed on the selected memory cell MC1. On the other hand, since the voltage Vs is applied to the unselected memory cells MC2, MC3, and MC4 via the local source lines SL2, SL3, and SL4, the current for the SET writing in the unselected memory cells MC2, MC3, and MC4 does not flow.

During the period from the time point t3 to the time point t4, the ground voltage GND is applied to all the local bit lines BL1, the local source lines SL1, SL2, SL3, and SL4. During the next period from the time point t4 to the time point t5, the SET write operation is performed on the selected memory cell MC2. In this case, the ground voltage GND is applied only to the local source line SL2, and the voltage Vs which has the same level as the write voltage Vs is applied to the local source lines SL1, SL3, and SL4. During the following period from the time point t6 to the time point t7, the SET write operation is performed on the selected memory cell MC3. In this case, the ground voltage GND is applied only to the local source line SL3, and the voltage Vs which has the same level as the write voltage Vs is applied to the local source lines SL1, SL2, and SL4. During the period from the time point t8 to the time point t9, the SET write operation is performed on the selected memory cell MC4. In this case, the ground voltage GND is applied only to the local source line SL4, and the voltage Vs which has the same level as the write voltage Vs is applied to the local source lines SL1, SL2, and SL3. Accordingly, the SET write operation is performed on the memory cells MC1~MC4 sequentially.

In the above method of writing SET, the writing is performed from the side of the local bit line. Since one local bit line is connected to a plurality of shared bit lines, the capacitance of one local bit line is larger than that of one local source line, and a large driving current is required when the SET write voltage is applied. In addition, when a write operation is performed on a selected memory cell, in order to prohibit unselected memory cells from being written, it is necessary to apply a writ-inhibiting voltage equal to the write voltage Vs to the unselected local source lines. In particular, in the case where the SET write operation is performed on a plurality of memory cells continuously as shown in FIG. 6, it is necessary to apply the write-inhibiting voltage to the unselected local source lines SL2, SL3, and SL4 during the period from the time point t2 to the time point t3, apply the write-inhibiting voltage to the unselected local source lines SL1, SL3, and SL4 during the period from the time point t4 to the time point t5, apply the write-inhibiting voltage to the unselected local source lines SL1, SL2, and SL4 during the period from the time point t6 to the time point t7, and apply the write-inhibiting voltage to the unselected local source lines SL1, SL2, and SL3 during the period from the time point t8 to the time point t9. Therefore, when the write voltage Vs is applied to the selected memory cell, in order to apply the write-inhibiting voltage to the unselected source lines, a supply source of the write-inhibiting voltage needs a high peak current. Moreover, the write-inhibiting voltage applied to the unselected local source lines is discharged subsequently, thereby causing unproductive power consumption.

Figure 7:
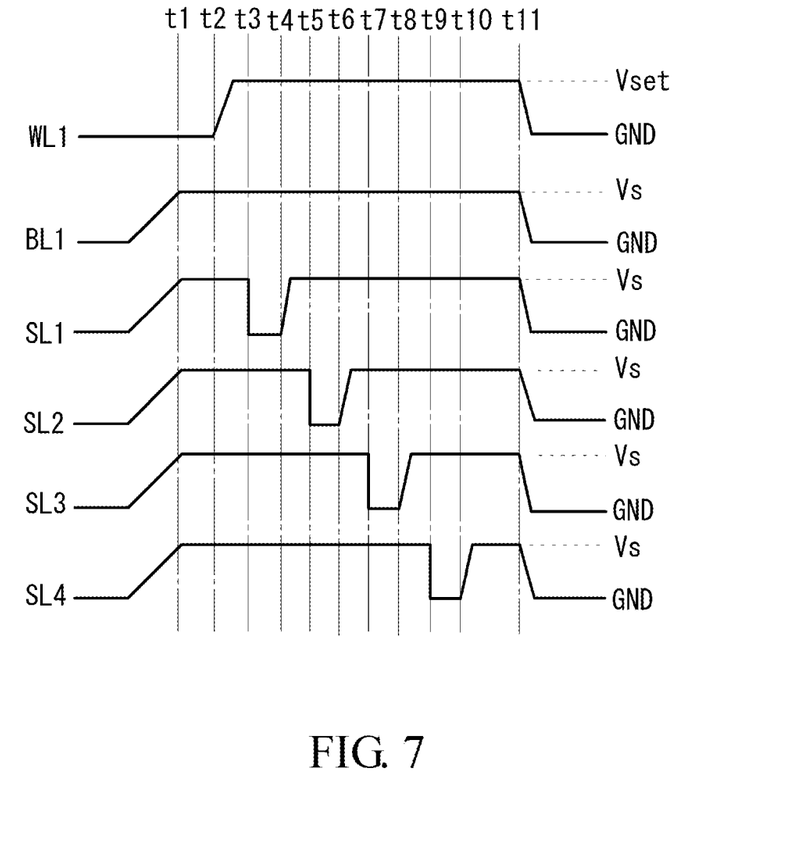
FIG. 7 is a timing diagram when a SET write operation is performed according to a preferred embodiment of the present invention.

Therefore, the following paragraphs will describe the inhibition of the peak power and the set write operation that can suppress the peak power and improves power consumption. FIG. 7 is a timing diagram of voltage waveforms when the SET write operation is performed continuously on the memory cells MC1~MC4 shown in FIG. 6.

At the time point t1 before the write operation, the local bit line and the local source lines SL1, SL2, SL3, and SL4 are pre-charged to a voltage Vs. At the time point t2, the selected word line WL1 is pre-charged from a ground voltage GND and rises to a write voltage Vset. During the period from the time point t3 to the time point t4, the SET write operation is performed on the selected memory cell MC1. In other words, a write voltage pulse is applied by discharging the voltage of the local source line SL1 connected to the selected memory cell MC1 to the ground voltage GND. As a result, a bias is applied to the selected memory cell MC1, and a SET write current flows from the local bit line BL1 to the local source line SL1. On the other hand, the pre-charged voltage Vs is applied to the unselected memory cells MC2, MC3, and MC4 via the shared bit line S_BL, and the unselected local source lines SL2, SL3, and SL4 are also at the pre-charged voltage Vs. Thus, no bias is applied to the non-selected memory cells MC2, MC3, and MC4, and the SET write current does not flow.

After the SET write operation on the selected memory cell MC1 is completed, the local source line SL1 is boosted to the voltage Vs from the ground voltage GND again at the time point t4. During the next period from the time point t5 to the time point t6, in order to perform the SET write operation on the selected memory cell MC2, the selected local source line SL2 is discharged to the ground voltage GND from the voltage Vs, such that the SET write current in the selected memory cell MC2 flows to the local source SL2 from the local bit line BL1. In the unselected memory cells MC1, MC3, and MC4, since the voltage Vs is being applied to the unselected local source lines SL1, SL3, and SL4, the SET write operation is not performed on the unselected memory cells MC1, MC3, and MC4. After the SET write operation on the selected memory cell MC2 is completed, the local source line SL2 is boosted to the voltage Vs from the ground voltage again at the time point t6.

Thereafter, similarly, during the period from the time point t7 to the time point t8, when the SET write operation is performed on the selected memory cell MC3, only the selected local source line SL3 is discharged to the ground voltage GND from the voltage Vs. During the period from the time point t9 to the time point t10, the SET write operation is performed on the selected memory cell MC4, only the selected local source line SL4 is discharged to the ground voltage GND from the voltage Vs.

According to the improved writing method of the embodiment, in the case where the SET writing is performed from the side of the bit line, the local bit line and the local source lines are pre-charged before the write operation, and when the write operation is performed, the write voltage is applied to the selected bit line, the voltage pre-charged to the selected local source lines is discharged, and the write pulse is applied to the selected memory cell. Thus, it becomes unnecessary to apply the write-inhibiting voltage to the unselected memory cells, and the peak current can be reduced when the SET write operation is performed on the selected memory cell.

Moreover, since one local bit line is connected to a plurality of shared bit lines S_BL, the load capacity of the local bit line is large, so it takes a certain time to boost the local bit line to the write voltage Vs. However, in the improved SET writing method, writing the memory cell does not need to boost the local bit line, and compared to the local source lines during the boosting, the slope of the local source line during the discharging is becomes steeper. Thus, in fact, the time required for the SET write operation can be shortened.

Moreover, in some embodiments, the write driver and read bias circuit 170 comprises a driving circuit for pre-charging the local source lines or a discharging circuit for discharging the local source lines to implement the above-mentioned writing method. However, the driving circuit or the discharging circuit here preferably comprises a current limiting circuit (for example, a resistance element) so that the currents larger than a certain voltage during the pre-charging or discharging cannot flow. If the wiring pitches between the local source lines become fine, the capacitive coupling ratio of the adjacent local source lines will increase, and there may be a possibility of writing interference during the pre-charging or discharging. For example, when the write operation is performed on the selected memory cell MC1, if the local source line SL1 is discharged sharply, the voltage of the adjacent local source line SL2 will also decrease due to the capacitive coupling. Thus, the unselected memory cell MC2 also generates a bias voltage, which generates a SET write current. In order to suppress this phenomenon, by limiting the current during discharge to below a certain level, the sharp voltage drop of the local source line SL1 is alleviated, and the voltage drop of the adjacent local source line is suppressed.

Moreover, for controlling the write intensity (controlling the resistance value), in addition to controlling the write voltage Vset (or Vreset) applied to the selected bit line, a current limiting circuit, such as a current mirror, is inserted on the bit-line-side or the source-line-side) is inserted, and the write intensity is controlled by a current limiting value. In other words, the current limiting circuit limits the discharge current of the pre-charge potential of the selected local source line during the discharging and controls the write intensity by changing its discharge current. For example, by releasing a relatively large current, the resistance variation of each pulse is increased; conversely, by releasing a relatively small current, the resistance variation of each pulse is reduced. For example, when the write driver and read bias circuit 170 performs a verification operation for the write operation and determines whether a pass or fail is present based on the current or voltage read by the sense amplifier 160. When a fail is present, the current limiting value may be changed to be less than or larger than the previous one.

As described above, through controlling the write intensity by changing the current limiting value of the current limiting circuit, the pre-charge voltage of Vset (or Vreset) applied to the selected word line can be constant. Thus, the control of the write disturbance during the pre-charging becomes easy, and the design of the voltage source of the write voltage Vset (or Vreset) also becomes easy, thereby obtaining the above-mentioned special effects.

In addition, when the selected memory cell MC1 is completely written and the local source line SL1 is boosted to the voltage Vs again, if the slope of the boosting is steep, the voltage of the adjacent region source line SL2 will be increased due to the capacitive coupling, which results in that the unselected memory cell MC2 is applied with a reverse bias from the local source lines, and an unexpectedly opposite write current flows in the unselected memory cell MC2. This write current is a current which flows only during the RESET write operation. In order to suppress this situation, when the local source line SL1 is boosted to the voltage Vs again, by limiting the current to below a certain level, the sharp voltage boosting of the local source line SL1 is alleviated, and the voltage boosting of the adjacent local source line is suppressed. The current limiting circuit is adjusted so that the slope of the pre-charging is gentler than the slope for the discharging.

In addition, the above embodiment shows an example wherein an write operation is performed on memory cells of 4 bits continuously. However, this is just an example. The number of bits for the continuous writing can be arbitrarily set. For example, it can be a 2-bit, 8-bit, 16-bit, or 32-bit. During the continuous writing, the selected word line maintains at the write voltage Vs. In addition, although the above-mentioned embodiment is an example of an write operation for each bit, the same effect can be obtained by simultaneously continuously performing the write operation on the memory cells of more than 2 bits.

Next, the RESET write operation will be described. The mode "RESET write" is an operation mode in which a variable resistance element is written to a high resistance state. In the mode "RESET write", the write driver and read bias circuit 170 applies a ground voltage GND to the local bit line BL1 and the unselected local source lines SL2~SLq of the selected group G1 and applies a write voltage Vr to the selected local source line SL1. A write voltage Vreset (Vreset>Vr) is applied to the selected word line WL1, and the ground voltage GND is applied to the unselected word lines. Further, all the local bit lines and the local source lines of the unselected groups G2~Gp are at the ground voltage GND.

Figure 8A:
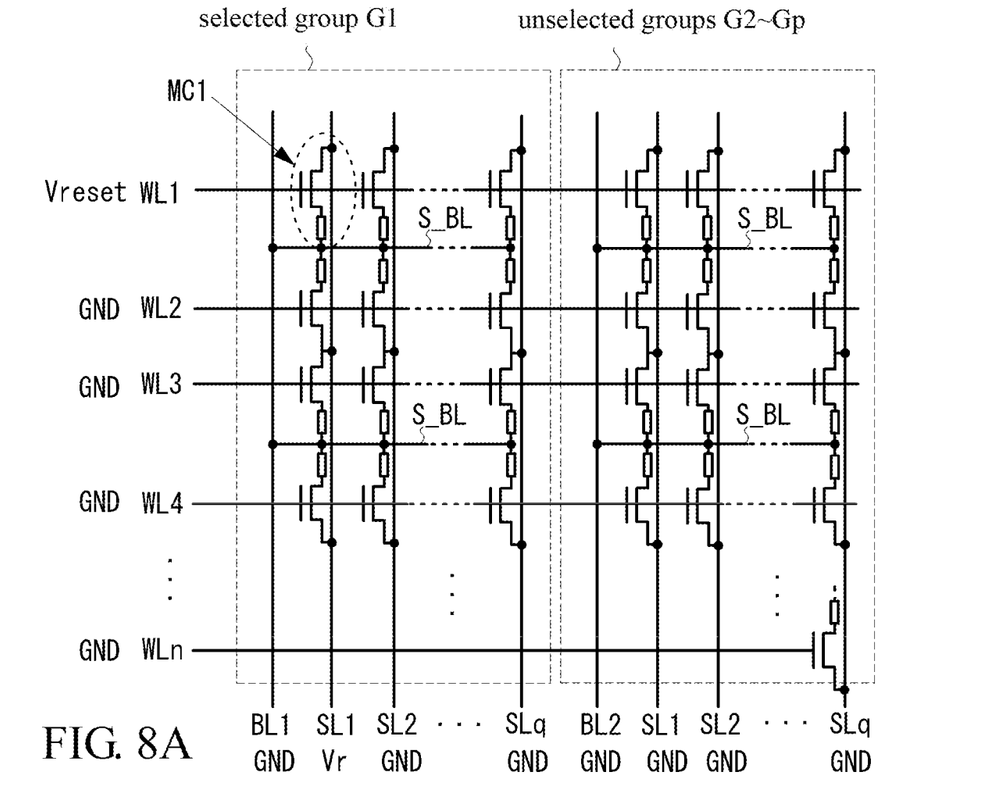
FIGS. 8A-8C are schematic diagrams showing a RESET write operation of a resistive random access memory according to an embodiment of the present invention.
Figure 8B:
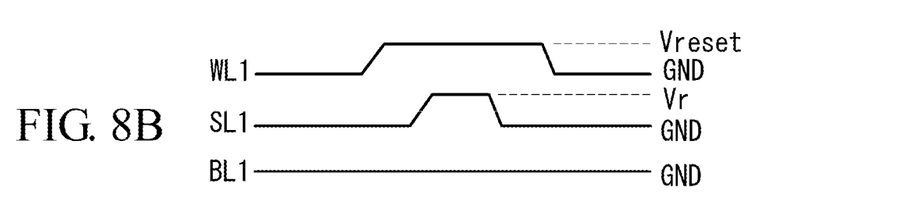

As shown in FIGS. 8A and 8B, the RESET write voltage Vreset is applied to the selected word line WL1, then, the write voltage Vr is applied to the selected local source line SL1, and the ground voltage GND is applied to the selected local bit line BL1. At this time, the shared bit line S_BL and the local bit line BL1 are at the same potential. In the case where the RESET write voltage Vreset is applied to the selected word line WL1, the accessing transistors which are disposed in the row direction and connected to the selected word line WL1 are turned on, and the bias voltage for the mode "RESET writing" is applied to the variable resistive element of the selected memory cell. On the other hand, since the ground voltage GND is applied to the unselected local source lines SL2~SLq, a bias voltage for the mode "RESET writing" is not applied to the variable resistance elements of the unselected memory cells.

Figure 8C:
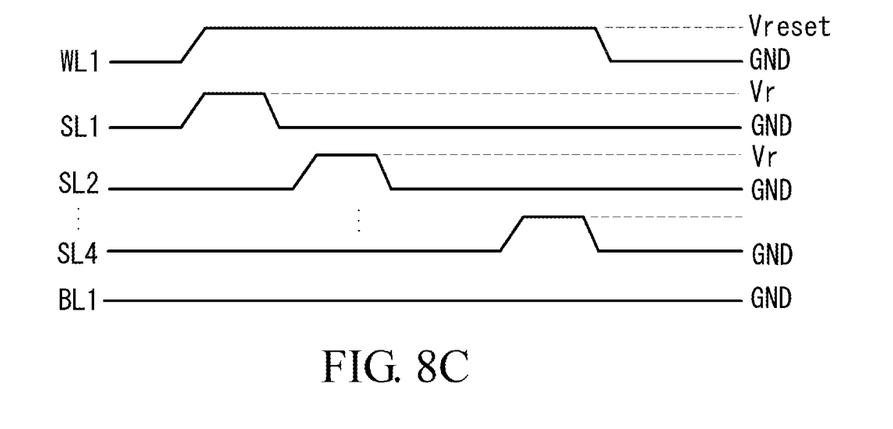

In addition, when the RESET write operation is performed continuously to a plurality of memory cells connected to the selected word line WL1, as shown in FIG. 8C, the write voltage Vr is sequentially applied to the local source lines SL1, SL2, . . . , SL4 for the state where the write voltage Vreset is applied to the selected word line WL1.

According to the present embodiment, the shared bit lines are configured in the memory array, so that a local bit line is shared by several memory cells. Compared with the prior arts where the bit lines are configured in a one-to-one relationship, the area efficiency of the memory array of the present embodiment can be improved. Further, the memory array is divided into a plurality of groups. Through enabling the sense amplifier 160 and the write driver and the read bias circuit 170 which are connected to the selected group and disabling the other circuits, it is possible to reduced power consumption. In addition, during the SET write operation, the local bit lines and the local source lines of the selected group are pre-charged. Thus, during a subsequent write operation, the selected local sources line are discharged, and the SET write bias is applied to the selected memory cells, thereby suppressing the peak current and improving power efficiency.

In the above embodiments, an example in which one sub-array is divided into a plurality of groups is shown, but the present invention is not necessarily limited to such a configuration. For example, it is also possible that one sub-array is equivalent to one group. In this case, the resistive memory 100 accesses the memory cells by taking one sub-array as a unit, and the unselected sub-arrays and the related circuits (such as the sense amplifiers) are disabled.

In the above embodiment, one local bit line is allocated in one group. In a second embodiment, one local source line is allocated in one group, and, however, this is just an example. In other embodiments, it is also possible to allocate a plurality of local bit lines or a plurality of local source lines in on group. For example, in the embodiment shown in FIG. 3, two local bit lines may be allocated to the leftmost side and the rightmost side of the group G1. In this case, the first shared bit line is connected to the local bit line on the leftmost side, and the second shared bit line is connected to the local bit line on the rightmost side, the first shared bit line is shared by q/2 memory cells in the row direction, and the second shared bit line is shared by q/2 memory cells in the row direction. Accordingly, compared with the case in which one shared bit line is shared by q memory cells in the row direction, the load capacitance of the above example can be reduced.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A resistive memory memorizing data using reversible and non-volatile variable resistance elements, comprising:
    an array area in which a plurality of memory cells arranged in a plurality of rows and a plurality of columns, wherein each of the plurality of memory cells comprises one of the plurality of variable resistance elements and an accessing transistor connected to the variable resistance element;
    a plurality of word lines connected to the memory cells in a row direction;
    at least one bit line extending in a column direction;
    a plurality of source lines extending in the column direction and connected to first electrodes of the memory cells in the column direction;
    a shared bit line connected to the at least one bit line, extending in the row direction, and connected to second electrodes of the memory cells in the row direction; and
    a writing device performing a write operation on the selected memory cells,
    wherein the writing device pre-charges the selected bit line and the selected source lines to a first voltage, and after applying a write voltage to the selected word line, the writing device applies a write pulse to the selected memory cell by discharging the corresponding selected source line.

2. The resistive memory as claimed in claim 1, wherein a slope for the pre-charging is gentler than a slope for the discharging.

3. The resistive memory as claimed in claim 1, wherein the writing device maintains the write voltage of the selected word line while at least two consecutive write pulses are applied.

4. The resistive memory as claimed in claim 1, wherein the writing device comprises a driving circuit for pre-charging the selected source lines to the first voltage, and the driving circuit comprises a current limiting circuit for limiting a current for the pre-charging.

5. The resistive memory as claimed in claim 1, wherein the writing device comprises a discharge circuit to discharge the corresponding selected source line, and the discharging circuit comprises a current limiting circuit for limiting a current for the discharging.

6. The resistive memory as claimed in claim 5, wherein the writing device controls writing intensity for the selected memory cell according to a current limit value of the current limiting circuit.

7. The resistive memory as claimed in claim 6, wherein the writing device comprises a driving circuit to pre-charge the source lines to a certain voltage.

8. The resistive memory as claimed in claim 1, wherein the writing device performs a SET write operation to cause at least one of the variable resistance elements to be a low resistance state.

9. The resistive memory as claimed in claim 1, wherein when the plurality of memory cells of the array area are arranged on n rows and q columns, the shared bit line is shared by q memory cells in the row direction.

10. The resistive memory as claimed in claim 1, wherein the plurality of memory cells in the array area are divided into a plurality of groups.

* * * * *